United States Patent
Sambucco et al.

(10) Patent No.: US 10,069,399 B1
(45) Date of Patent: Sep. 4, 2018

(54) SELECTING AN ASPECT RATIO FOR CURRENT MONITORING

(71) Applicant: Infineon Technologies Austria AG, Villach (AT)

(72) Inventors: Adriano Sambucco, Villach (AT); Emiliano Puia, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/485,088

(22) Filed: Apr. 11, 2017

(51) Int. Cl.
| | |
|---|---|
| *G05F 1/00* | (2006.01) |
| *G05F 3/04* | (2006.01) |
| *G05F 3/08* | (2006.01) |
| *G05F 3/16* | (2006.01) |
| *G05F 3/20* | (2006.01) |
| *H02M 1/088* | (2006.01) |
| *G01R 15/14* | (2006.01) |
| *H02M 1/00* | (2006.01) |

(52) U.S. Cl.
CPC ............ *H02M 1/088* (2013.01); *G01R 15/14* (2013.01); *H02M 2001/0009* (2013.01)

(58) Field of Classification Search
CPC ............... G05F 1/59; G05F 3/16; G05F 3/262
USPC .................. 323/266, 269–275, 312, 315–317
See application file for complete search history.

(56) References Cited

U.S. PATENT DOCUMENTS

| | | | |
|---|---|---|---|
| 9,152,163 B1 | 10/2015 | Fabbro et al. | |
| 9,335,779 B2 | 5/2016 | Sambucco | |
| 2002/0163379 A1* | 11/2002 | Kimura | G05F 3/262 327/540 |
| 2008/0136392 A1 | 6/2008 | Balakrishnan et al. | |
| 2012/0161741 A1* | 6/2012 | Zambetti | G05F 3/245 323/294 |
| 2014/0320095 A1* | 10/2014 | Sambucco | G05F 1/46 323/271 |
| 2015/0261248 A1* | 9/2015 | Sambucco | G05F 3/30 323/316 |
| 2016/0124027 A1 | 5/2016 | Sambucco et al. | |
| 2016/0124455 A1 | 5/2016 | Sambucco et al. | |

\* cited by examiner

*Primary Examiner* — Gary Nash
(74) *Attorney, Agent, or Firm* — Shumaker & Sieffert, P.A.

(57) ABSTRACT

In some examples, a device includes a power switch, a sensing switch configured to conduct an electrical current based on an electrical current conducted by the power switch. In some examples, the device also includes trimming circuitry configured to generate a monitored electrical current based on an aspect ratio of the trimming circuitry and based on the electrical current conducted by the sensing switch, wherein the aspect ratio of the trimming circuitry is adjustable.

21 Claims, 6 Drawing Sheets

SELECTING AN ASPECT RATIO FOR CURRENT MONITORING

TECHNICAL FIELD

This disclosure relates to power electronics circuitry.

BACKGROUND

A sensing switch may be positioned in parallel with a power switch and configured to mirror the electrical current conducted by the power switch. The ratio of the electrical current conducted by the power switch to the electrical current conducted by the sensing switch may be expressed as N:1. In some examples, the actual value of N in a device may be different than the target value of N in the device. The ratio of electrical currents may be based on the ratio of the sizes of the two switches.

SUMMARY

This disclosure describes techniques for generating a monitored electrical current that is indicative of the electrical current conducted by a power switch. The techniques of this disclosure include selecting an aspect ratio for trimming circuitry. The trimming circuitry may generate the monitored electrical current based on its aspect ratio and based on the electrical current conducted by the sensing switch. Based on the results of a test of the monitored electrical current, a technician or processing circuitry may select an aspect ratio for the trimming circuitry. Therefore, the monitored electrical current generated by the trimming circuitry may more accurately reflect the target ratio of the electrical current conducted by the power switch to the electrical current conducted by the sensing switch.

In some examples, a device including a power switch, a sensing switch configured to conduct an electrical current based on an electrical current conducted by the power switch. The device also includes trimming circuitry configured to generate a monitored electrical current based on an aspect ratio of the trimming circuitry and based on the electrical current conducted by the sensing switch, wherein the aspect ratio of the trimming circuitry is adjustable.

In some examples, a method is for monitoring an electrical current conducted by a power switch, where the method includes monitoring an electrical current generated by trimming circuitry, wherein the trimming circuitry is configured to generate the monitored electrical current based on an aspect ratio of the trimming circuitry and based on an electrical current conducted by a sensing switch, and wherein the sensing switch is configured to conduct the electrical current based on an electrical current conducted by the power switch. The method further includes controlling the aspect ratio of the trimming circuitry based on the monitored electrical current generated by the trimming circuitry.

In some examples, a power conversion system includes half-bridge circuitry including a high-side power switch and a low-side power switch. The power conversion system further includes a high-side sensing switch configured to conduct an electrical current based on an electrical current conducted by the high-side power switch and a low-side sensing switch configured to conduct an electrical current based on an electrical current conducted by the low-side power switch. The power conversion system also includes trimming circuitry configured to generate a monitored electrical current based on an aspect ratio of the trimming circuitry and based on the electrical current conducted by the high-side sensing switch or the electrical current conducted by the low-side sensing switch, wherein the aspect ratio of the trimming circuitry is adjustable.

The details of one or more examples are set forth in the accompanying drawings and the description below. Other features, objects, and advantages will be apparent from the description and drawings, and from the claims.

DETAILED DESCRIPTION

Figure 1:
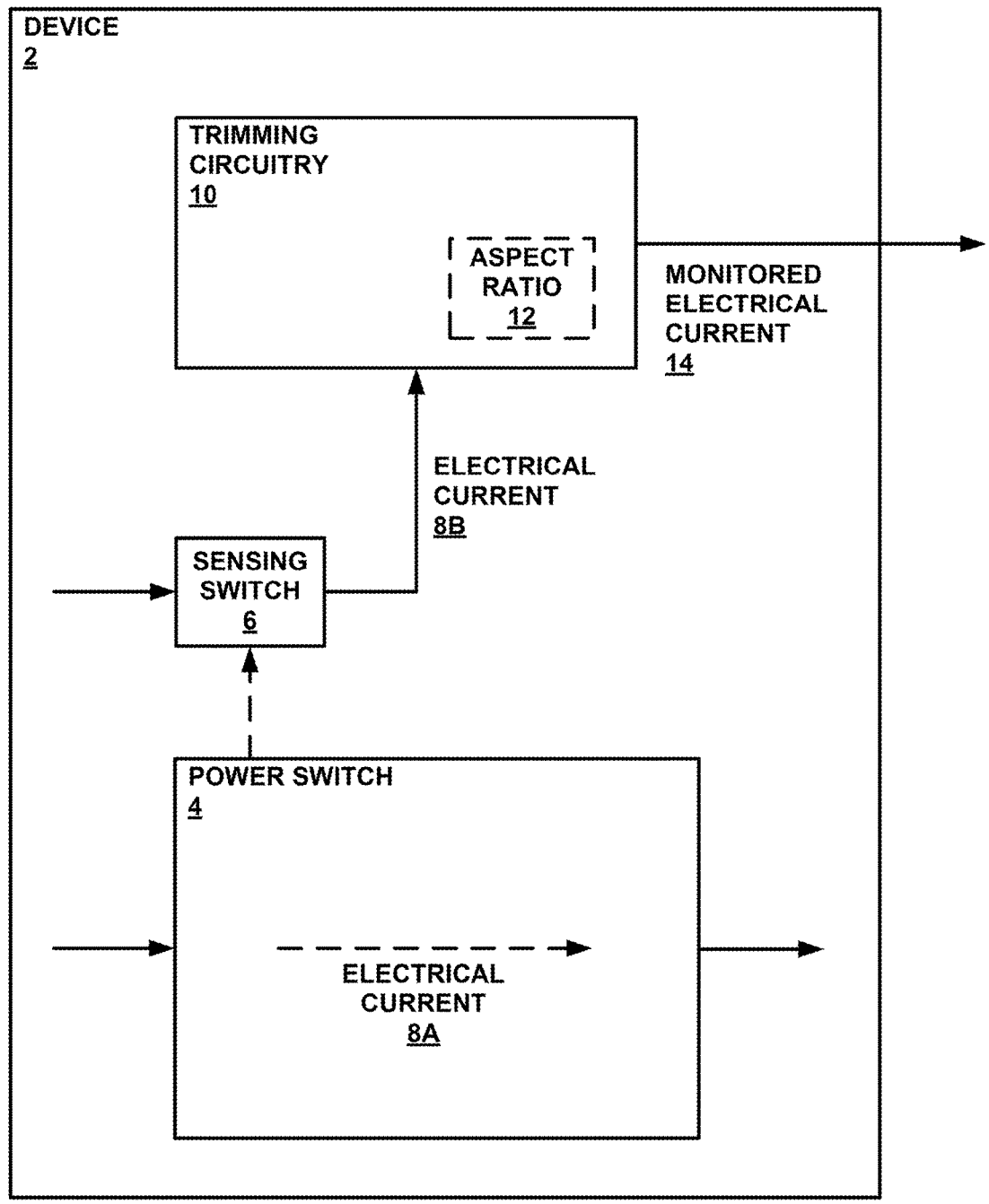
FIG. 1 is a conceptual block diagram of a device including trimming circuitry configured to generate a monitored electrical current based on an aspect ratio of the trimming circuitry and the electrical current conducted by a sensing switch, in accordance with some examples of this disclosure.

The techniques of this disclosure may improve power electronics by reducing the spread of the ratio between the electrical current conducted by a power switch and a monitored electrical current generated by trimming circuitry. In some examples, a device of this disclosure may include one or more monolithic mirror structures. The ratio between the power switch electrical current and the monitored electrical current may be adjustable by several methods and/or configurations. By adjusting the current ratio, a device of this disclosure may generate a more reliable monitored electrical current, which may allow more accurate monitoring of the power switch electrical current, along with lower power dissipation.

A device of this disclosure may move the trimming operation from the power switch to front-end circuitry such as trimming circuitry. In this way, the trimming of the current ratio may not be limited by the voltage drop of the metallization on the power switch, which may possibly increase the trimming range. The temperature of the device may have a relatively small effect on the operation of the trimming circuitry because it employs a single "tapping point" which makes the trimming circuitry, ideally, temperature independent. Other arrangements including more than one tapping point may, in some examples, depend on the temperature of the components. It may also be possible to trim the high-side current ratio and to match it to the low-side current ratio, for applications that include a half bridge circuit. Moreover, the device may need only one tapping point contacting the source of the power switch, reducing the number of pads in the device.

Other methods for adjusting a monitored electrical current may include complicated circuitry that takes up more space on a semiconductor die, as compared to the operational amplifiers and trimming circuitry of this disclosure. Other methods may also have greater dependence on temperature than the methods of this disclosure. Thus, in some examples, the techniques of this disclosure may allow for smaller and more accurate devices.

A device of this disclosure may have several unique ratios between devices and circuits. The "aspect ratio" of the trimming circuitry may be defined as the ratio of the number of active transistors in one branch of the trimming circuitry to the number of active transistors in another branch of the trimming circuitry. The "aspect ratio" may also be defined as the ratio of the electrical current through one branch of the trimming circuitry to the electrical current through another branch of the trimming circuitry. The "aspect ratio" of the trimming circuitry may be represented herein as L:M or M:L, where L is the number of active transistors in one branch and M is the number of active transistors in another branch. In some examples, the trimming circuitry may include more than two branches, and one of the branches may include a single active transistor. The ratio of the single-transistor branch to the other branches may be represented as 1:L and 1:M. The ratios of 1:L and 1:M are not referred to as aspect ratios herein.

A device of this disclosure may also include a ratio of the power switch to the sensing switch, which may be represented as N:1, where the power switch is N times larger than the sensing switch and/or include N times more modules or cells than the sensing switch. The electrical current conducted by the power switch may also be N times larger than the electrical current conducted by the sensing switch. This disclosure may not refer to the ratio of N:1 as an aspect ratio.

FIG. 1 is a conceptual block diagram of a device 2 including trimming circuitry 10 configured to generate a monitored electrical current 14 based on an aspect ratio 12 of the trimming circuitry 10 and the electrical current 8B conducted by a sensing switch 6, in accordance with some examples of this disclosure. Device 2 includes power switch 4, sensing switch 6, and trimming circuitry 10. Device 2 may be a power electronics device, an analog electrical device, an embedded system, an integrated circuit (IC) device, a power conversion device, a motor driver circuit, and/or any other electrical device. In some examples, device 2 may be a single integrated semiconductor die or more than one semiconductor die. Device 2 may be configured to deliver electrical current 8A to an electrical load. The electrical load connected to a switch node that is electrically connected to power switch 4.

In some examples, device 2 may be a power conversion device, such as an alternating-current-to-direct-current (AC/DC) converter, an AC/AC converter, or a DC/DC converter. Device 2 may include two power switches arranged as a half-bridge circuit and configured to generate an output signal at a switch node that is positioned between the two power switches. In some examples, device 2 may be a multiphase power converter and may include two or more half-bridge circuits or two or more H-bridge circuits. Each power switch of device 2 may include a sensing switch that includes one or more modules of device 2, where device 2 may include numerous modules (i.e., cells or transistors) and each power switch includes two or more modules connected in parallel. In some examples, device 2 may operate as a buck converter, a boost converter, a buck-boost converter, a flyback converter, a resonant mode converter such as an LLC converter, and/or a multiphase power converter.

Power switch 4 is configured to conduct electrical current 8A. Electrical current 8A may flow from a first load terminal of power switch 4 to a second load terminal of power switch 4 based on the voltage at a control terminal of power switch 4. Based on the voltage at the control terminal of power switch 4, power switch 4 may turn on and off. Power switch 4 may be configured to receive electrical power from a power source, modify it, and deliver the electrical power to an electrical load. The electrical power transmitted by power switch 4 may also depend on the duty cycle of the control signals received by power switch 4. Power switch 4 and/or sensing switch 6 may include, but are not limited to, any type of field-effect transistor (FET), a bipolar junction transistor (BJT), an insulated-gate bipolar transistor (IGBT), a high-electron-mobility transistor (HEMT) such as a gallium-nitride (GaN) based transistor or a silicon carbide (SiC) transistor, or another element that uses voltage for its control.

Power switch 4 and/or sensing switch 6 may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. In some examples, SiC switches may experience lower switching power losses. Improvements in magnetics and faster switching, such as GaN and SiC switches, may support higher frequency converters. These higher frequency circuits may require control signals to be sent with more precise timing, as compared to lower-frequency circuits.

In some examples, power switch 4 may include two or more cells or modules connected in parallel. Each of the cells or modules of power switch 4 may be a transistor with two load terminals and a control terminal. Sensing switch 6 may include one or more cells. In some examples, the drain terminals of the cells of power switch 4 and the cells of sensing switch 6 may be electrically connected, and the gate terminals of the cells of power switch 4 and the cells of sensing switch 6 may be electrically connected. The source terminals of the cells of power switch 4 may be electrically connected to a switch node of device 2, while the source terminals of the cells of sensing switch 6 may be electrically connected to trimming circuitry 10. Thus, power switch 4 and sensing switch 6 may be a part of the same semiconductor die, even though a load terminal (e.g., a source terminal) of sensing switch 6 may be electrically disconnected from a load terminal (e.g., a source terminal) of power switch 4.

Sensing switch 6 is configured to conduct electrical current 8B based on electrical current 8A. The ratio of electrical currents 8A and 8B may be called a current ratio or a geometrical ratio. The variable N may represent the actual ratio of electrical currents 8A and 8B. The ratio N may be based on the ratio of the sizes of power switch 4 and sensing switch 6. In some examples, the ratio N may be one thousand, ten thousand, or thirty thousand, where electrical current 8A is N times larger than electrical current 8B. In some examples, a load terminal of power switch 4 may be electrically connected to a load terminal of sensing switch 6, and a control terminal of power switch 4 may be electrically connected to a control terminal of sensing switch 6. In some examples, switches 4 and 6 may have a common control terminal (e.g., gate terminal) and a common load terminal (e.g., drain terminal). Thus, power switch 4 and sensing switch 6 may be configured to conduct electrical currents 8A and 8B based on the same control signals.

According to the techniques described herein, trimming circuitry 10 can be configured to generate monitored electrical current 14 based on aspect ratio 12 and based on electrical current 8B. Aspect ratio 12 may be based on a number of active transistors in trimming circuitry 10 that are configured to conduct electricity in parallel. The transistors of trimming circuitry 10 may also be called modules, as explained in the description of FIG. 4. Trimming circuitry 10 may include two or more branch circuits, where one of the branch circuits may be configured to generate monitored electrical current 14. In some examples, trimming circuitry 10 may include current mirror circuitry, where one or more branch circuit of trimming circuitry 10 may be configured to conduct an electrical current based on the electrical current of another branch circuitry. Aspect ratio 12 may represent the ratio of electrical currents in two different branch circuits of trimming circuitry 10. Aspect ratio 12 may also be based on the combined width-to-length ratios of the transistors and/or based on the on-resistances of the transistors.

Figure 2:
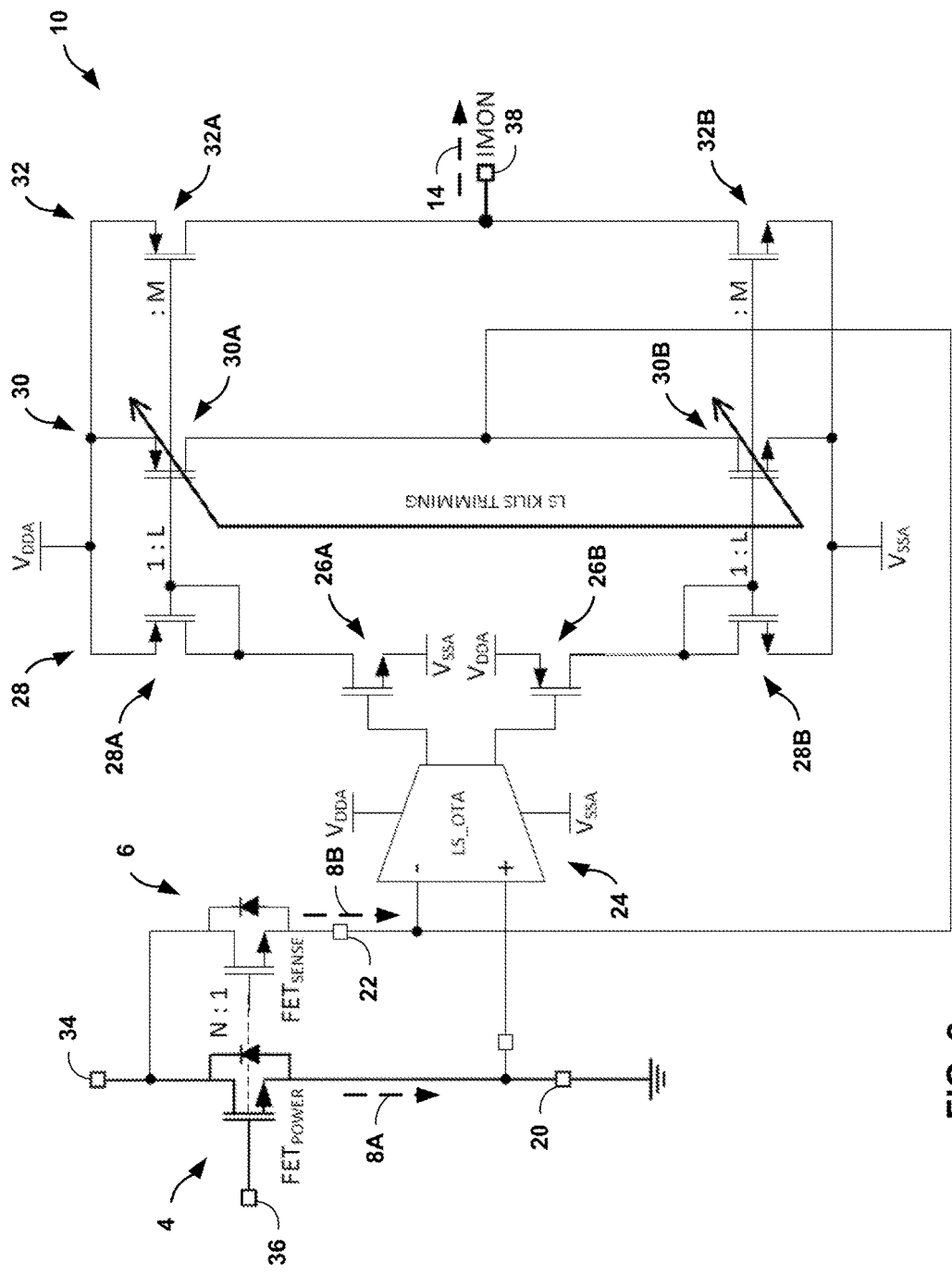
FIG. 2 is a circuit diagram of the device of FIG. 1, in accordance with some examples of this disclosure.
Figure 3:
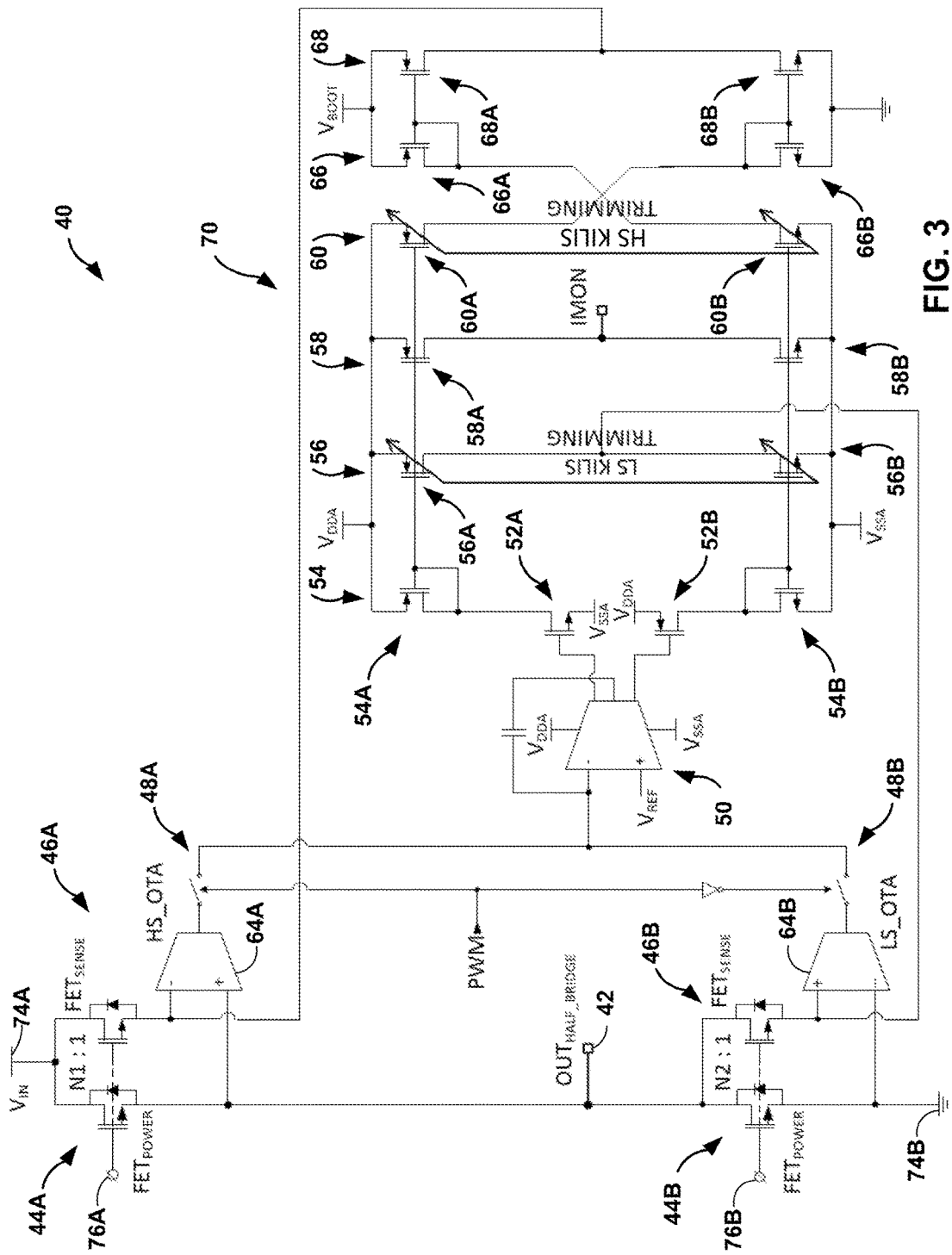
FIG. 3 is a circuit diagram of a power conversion system including a high-side power switch and a low-side power switch, in accordance with some examples of this disclosure.

In some examples, trimming circuitry 10 may be configured to trim electrical current 8B in order to generate monitored electrical current 14 at a lower amplitude than electrical current 8B. The lower amplitude of monitored electrical current 14 may result in lower power consumption of device 2. Electrical current 8B may be trimmed to generate monitored electrical current 14 based on aspect ratio 12, which may be adjustable. In some examples, the aspect ratio of each figure of this disclosure may be defined the same or differently. For example, FIG. 2 depicts only one aspect ratio in trimming circuitry 10, while FIG. 3 depicts a high-side aspect ratio and a low-side aspect ratio in trimming circuitry 70.

Monitored electrical current 14 may flow through a resistor. A microcontroller and/or processing circuitry may monitor the voltage drop across the resistor caused by monitored electrical current 14. In some examples, the microcontroller may convert the voltage drop to a digital value. The microcontroller may use the digital value to determine if electrical current 8A is too high or too low. The microcontroller may adjust the duty cycle of the control signals delivered to the control terminal of power switch 4 to adjust the amplitude of electrical current 8A. Device 2 may generate monitored electrical current 14 at a lower amplitude in order to reduce the power dissipation caused by monitored electrical current 14.

In accordance with the techniques of this disclosure, aspect ratio 12 can be adjustable. By adjusting aspect ratio 12, the amplitude of monitored electrical current 14 may be adjusted to a desired level. During the operation of device 2, processing circuitry may monitor the level of monitored electrical current 14 to determine the amplitude of electrical current 8A. Determining the amplitude of electrical current 8A may be desirable because device 2 may deliver electrical current 8A to an electrical load.

In some examples, the designers of device 2 may choose the ratio between electrical currents 8A and 8B (N) to be a target value, such as thirty thousand or another relatively large value. In some examples, the target value for N may also be one hundred, one thousand, ten thousand, thirty thousand, or one hundred thousand. After manufacture of device 2, N may be equal to the target value or may be different than the target value. If N is different than the target value, a KILIS factor may be adjusted closer to the target value by adjusting the number of active transistors configured to conduct electricity in parallel in trimming circuitry 10. In some examples, trimming circuitry 10 may include passive elements such as resistors, capacitors, or inductors, and aspect ratio 12 may be adjusted by adjusting, connecting, and/or disconnecting the passive elements. In some examples, aspect ratio 12 may be adjustable by controlling transistors and/or passive elements. Additionally or alternatively, aspect ratio 12 may also be adjustable by any other suitable means that adjusts the current ratio or a current mirror in trimming circuitry 10 in order to trim monitored electrical current 14 to a desirable amplitude.

The KILIS factor may represent the actual ratio of electrical current 8A to electrical current 8B, where N is the ratio of electrical current 8A to electrical current 8B before adjustment. Adjusting, or trimming, the KILTS factor may result in trimming or modifying monitored electrical current 14, such that monitored electrical current 14 is a more accurate representation of electrical current 8A. The KILIS factor, which is explained further below, may be based on aspect ratio 12, such that adjustment of the aspect ratio 12 may result in adjustment of the KILIS factor.

FIG. 2 is a circuit diagram of the device of FIG. 1, in accordance with some examples of this disclosure. Device 2 may include power switch 4, sensing switch 6, trimming circuitry 10, operational amplifier 24, and monitored node 38. Trimming circuitry 10 may include transistors 26A and 26B and branch circuitries 28, 30, and 32, where each branch circuitry includes one of p-channel transistors 28A, 30A, and 32A and one of n-channel transistors 28B, 30B, and 32B.

In some examples, aspect ratio 12 of FIG. 2 may be based on the ratio between the number of active transistors in branch circuitry 30 and the number of active transistors in branch circuitry 32. If each of transistors 28A and 28B includes one transistor, the aspect ratio of branch circuitries 28 and 30 may be equal to the number of active transistors connected in parallel in each of transistors 30A and 30B, represented by the variable L. In some examples, trimming circuitry 10 may also include inactive transistors that are not configured to conduct electricity in parallel. The aspect ratio of branch circuitries 28 and 32 may be equal to the number of active transistors connected in parallel in each of transistors 32A and 32B, represented by the variable M. Aspect ratio 12 of FIG. 2 may be equal to the ratio of L to M or M to L. Aspect ratio 12 may also be based on the sizes and other characteristics of the transistors in branch circuitry 30 and 32. In some examples, device 2 may include a high-side aspect ratio and a low-side aspect ratio, where the high-side aspect ratio may be equal to or different than the low-side aspect ratio.

Operational amplifier 24 may be configured to drive branch circuitry 28 based on electrical currents 8A and 8B. Operational amplifier 24 may be configured to receive source-terminal voltages 20 and 22, which may be based on electrical currents 8A and 8B, and deliver driving signals to transistors 26A and 26B. Branch circuitry 30 may be configured to be driven by electrical current 8B and source-terminal voltage 22. Branch circuitry 32 may be configured to generate monitored electrical current 14 based on aspect ratio 12 between branch circuitries 30 and 32.

Each of branch circuitries 30 and 32 may include a number of active upper p-channel transistors and a number of active lower n-channel transistors. In some examples, the upper transistors 28A, 30A, and 32A may include p-channel transistors and/or any other transistors. In some examples, the lower transistors 28B, 30B, and 32B may include n-channel transistors and/or any other transistors. For example, FIG. 2 depicts the upper transistors of branch circuitry 30 as transistor 30A, but there may be more than one upper transistor configured to conduct electricity in parallel in branch circuitry 30. Aspect ratio 12 may be adjustable by selecting the number of active transistors configured to conduct electricity in branch circuitry 30. The amplitude of monitored electrical current 14 may be based on the number of active upper transistors connected in parallel in branch circuitry 30 and based on the number of active lower transistors connected in parallel in branch circuitry 30. The amplitude of monitored electrical current 14 may be based on the number of active transistors connected in parallel in branch circuitry 32, but the number of active transistors connected in parallel in branch circuitry 32 may not be adjustable in some examples.

Device 2 provides a degree of freedom and the opportunity to trim any offset current on monitored electrical current 14 when electrical current 8A is equal to zero, i.e., no current is flowing through power switch 4. This can be achieved by trimming separately the p-channel mirrors and the n-channel mirrors present in the output branch of the loop, i.e., trimming circuitry 10. The p-channel mirrors may include transistors 28A, 30A, and 32A, and the n-channel mirrors may include transistors 28B, 30B, and 32B. Device 2 can work with positive and negative amplitudes of electrical current 8A.

Device 2 includes power switch 4 and sensing switch 6, where power switch 4 may be N times larger than sensing switch 6. Device 2 also comprises a current reading front-end that reads a suitable potential over the source metallization of power switch 4 and forces the potential on the source terminal of sensing switch 6. The current reading front-end uses operational amplifier 24 driving p-channel mirrors and n-channel mirrors in trimming circuitry 10. The current mirrors in branch circuitry 30, of multiplicity or ratio L, are within the regulation loop and supply the current flowing through sensing switch 6. In some examples, the ratio L may be the ratio of transistors in branch circuitry 28 and 30.

The addition of branch circuitry 32 of transistors of multiplicity M, matched to those of ratio L but lying outside the linear loop, provides the current sensing information at monitored node 38. The trimming of the KILTS factor is achieved by modifying the ratio L with respect to the ratio M, for example by adding or subtracting transistors (i.e., modules) to the upper transistors and the lower transistors in branch circuitry 30.

The trimming operation is done completely at the front-end circuit (i.e., a driver integrated circuit), which is trimming circuitry 10. Therefore, other trimming solutions, which may rely heavily on characteristics of power switch 4, may be avoided. Device 2 allows easy trimming or adjusting high-side KILIS factor and low-side KILTS factor to match the KILIS factors to the same value. The KILIS factor is explained in detail below and may be equal to the actual ratio of electrical currents 8A and 8B.

Moreover, the system allows trimming of any offset current in monitored electrical current 14 by modifying separately the p-channel mirrors and the n-channel mirrors present in branch circuitry 30 of the loop. The target of the trimming is to obtain the maximum accuracy in the amplitude of monitored electrical current 14 by compensating the process spread of the geometrical ratio N, which may or may not be equal to the target value after device 2 is manufactured.

Device 2 may include a KILTS factor, which is a parameter characterizing the current sensing system and defined by equation (1). The KILIS factor may represent electrical current 8A ($I_{LOAD}$) divided by electrical current 8B ($I_{SENSE}$). In some examples, $I_{LOAD}$ may be an electrical current conducted through a switch node of a half-bridge circuit including power switch 4 and another power switch.

$$k_{ILIS} = \frac{I_{LOAD}}{I_{SENSE}} \quad (1)$$

Equation (1) may be rewritten as equation (2) based on the relationship between electrical current 8A and monitored electrical current 14. This relationship may be based on ratio L of branch circuitry 28 and branch circuitry 30. The relationship may be based on ratio M of branch circuitry 28 and branch circuitry 32. In some examples, the ratio of L divided by M, or M divided by L, may be equal to aspect ratio 12 of FIG. 2.

$$k_{ILIS} = \frac{I_{LOAD}}{I_{SENSE}} = \frac{I_{LOAD}}{\frac{L}{M} \times I_{MON}} = \frac{M}{L} \times \frac{I_{LOAD}}{I_{MON}} \quad (2)$$

KILIS is a system parameter, and it may be necessary to know its default value. Therefore, in the absence of trimming, it may be useful to have known default values of L and M ($L_{DEF}$ and $M_{DEF}$). Based on these values, equation (2) may be rewritten as equation (3):

$$k_{ILIS} = \frac{M_{DEF}}{L_{DEF}} \times \frac{I_{LOAD}}{I_{MON}} \quad (3)$$

$L_{DEF}$ and $M_{DEF}$ may be constants such as, for example, $L_{DEF}$ equals five and $M_{DEF}$ equals one. As shown in FIG. 2, the proposed trimming technique varies ratio L of the modules and/or transistors within the regulation loop while keeping constant ratio M of the modules and/or transistors out of the loop. In other words, L can be modified and M may have a constant value ideally equal to $M_{DEF}$, but in practice this quantity may be subject to the mismatch between the modules forming L and the modules forming M. Monitored electrical current 14 is, therefore, given by the following expression:

$$I_{IMON} = \frac{M}{L} \times I_{SENSE} = \frac{M}{L} \times \frac{I_{LOAD}}{N} \quad (4)$$

Ratio N may be equal to electrical current 8A divided by electrical current 8B. Where it was assumed that $I_{LOAD}$ equals electrical current 8A and hence the matching between power switch 4 and sensing current 6 was exploited. Replacing equation (4) into equation (3) yields:

$$k_{ILIS} = \frac{L}{L_{DEF}} \times \frac{M_{DEF}}{M} \times N \quad (5)$$

Equation (5) shows that the KILTS factor is a linear function of ratio L of the modules and/or transistors. Therefore, ratio L may be used for compensating the process spread of the geometrical ratio N without acting on power switch 4. Moreover, L can be used for compensating mismatch errors which make M different from $M_{DEF}$ or which make the default value of L different from $L_{DEF}$. In the absence of trimming and under the assumption that there are no mismatch errors, L equals $L_{DEF}$, M equals $M_{DEF}$ and therefore KILIS equals N. In general, the parameter L may be adjusted to the value that satisfies the following relationship:

$$L = \frac{k_{ILIS}}{N} \times \frac{M}{M_{DEF}} \times L_{DEF} \quad (6)$$

FIG. 3 is a circuit diagram of a power conversion system 40 including a high-side power switch 44A and a low-side power switch 44B, in accordance with some examples of this disclosure. Power switches 44A and 44B may be a part of a half-bridge circuit that operates based on control signals delivered at control terminals 76A and 76B and voltage supplies 74A and 74B. The half-bridge circuit may deliver an output current at switch node 42.

At each of control terminals 76A and 76B, a control terminal of one of power switches 44A and 44B may be electrically connected to a control terminal of one of sensing switches 46A and 46B. At nodes 74A and 42, a load terminal of one of power switches 44A and 44B may be electrically connected to a load terminal of one of sensing switches 46A and 46B. As a result, sensing switches 46A and 46B may be configured to conduct electrical currents based on the electrical currents conducted by power switches 44A and 44B. Power conversion system 40 may also include gate driver circuitry that is configured to deliver control signals at control terminals 76A and 76B to power switches 44A and 44B and to sensing switches 46A and 46B.

One of operational amplifiers 64A and 64B may drive operational amplifier 50, depending on which of power switches 44A and 44B is active and based on the electrical currents conducted by power switches 44A and 44B and sensing switches 46A and 46B. A pulse-width modulated (PWM) signal may control switches 48A and 48B to connect or disconnect operational amplifiers 64A and 64B from an input node of operational amplifier 50. In some examples, the control signals for power switches 44A and 44B received at control terminals 76A and 76B may be PWM signals, pulse-density modulated (PDM) signals, and/or any other suitable waveforms. The gate driver circuitry may be configured to control whether trimming circuitry 70 generates a monitored electrical current at the IMON node in FIG. 3 based on the electrical current conducted by sensing switch 46A or 46B by opening and closing switches 48A and 48B to control whether operational amplifier 64A or 64B drives trimming circuitry 70.

Operational amplifier 50 may be configured to drive branch circuitry 54 of trimming circuitry 70 through transistors 52A and 52B. Thus, branch circuitry 54 may be configured to be driven by operational amplifier 64A or 64B. The source-terminal voltage of high-side sensing switch 46A may be driven by branch circuitries 68, 66, and 60. The source-terminal voltage of low-side sensing switch 46B may be driven by branch circuitry 56. Branch circuitry 58 may be configured to generate a monitored electrical current at the IMON node in FIG. 3.

The monitored electrical current may be based on a ratio between branch circuitry 56 and branch circuitry 58 or based on a ratio between branch circuitry 60 and branch circuitry 58. The high-side ratio of trimming circuitry 70 may depend on the number of active transistors configured to conduct electricity in branch circuitries 58 and 60. The low-side ratio of trimming circuitry 70 may depend on the number of active transistors configured to conduct electricity in branch circuitries 56 and 58.

The monitored node of device 40 may be electrically connected to a microcontroller and/or processing circuitry that monitors the monitored electrical current and/or converts the monitored electrical current to a digital value. The processing circuitry may be configured to monitor the electrical current generated by trimming circuitry 70. The processing circuitry may be configured to control the high-side ratio and/or the low-side ratio of trimming circuitry 70 based on the amplitude of the monitored electrical current.

Figure 4:
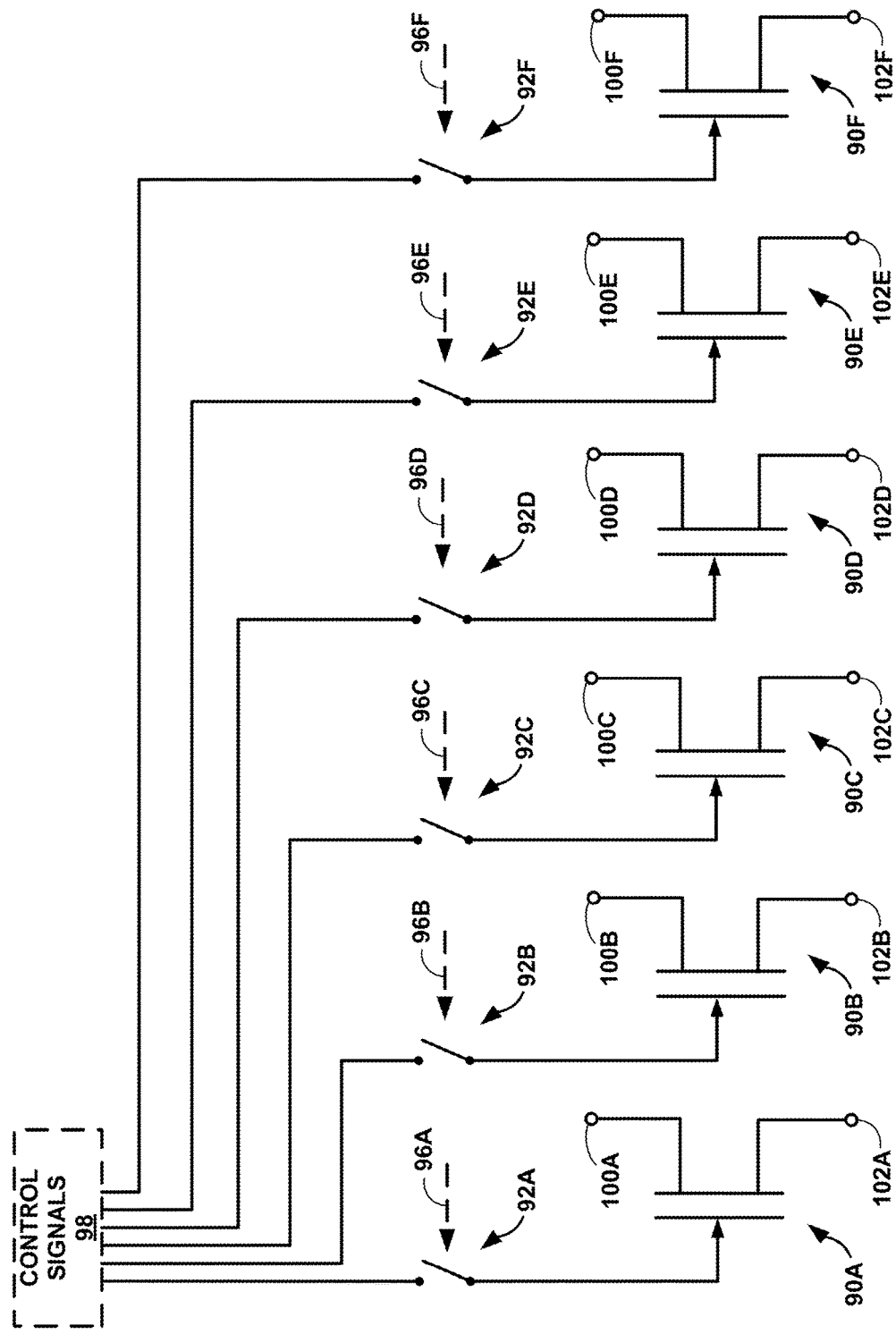
FIG. 4 is a circuit diagram of a portion of the trimming circuitry of the devices of any of FIGS. 1-3, in accordance with some examples of this disclosure.

FIG. 4 is a circuit diagram of a portion of the trimming circuitry 10 of device 2 in FIGS. 1 and 2 or trimming circuitry 70 of device 40 in FIG. 3, in accordance with some examples of this disclosure. Transistors 90A-90F may be equivalent to one of transistors 56A, 56B, 60A, or 60B. Transistors 90A-90F may be n-channel transistors or p-channel transistors. Connected in parallel, transistors 90A-90F may be configured to conduct electricity as a single mirror because the total electrical current through transistors 90A-90F may be the sum of the electrical currents through the active transistors of transistors 90A-90F. In some examples, transistors 90A-90F may connected in parallel because all of source terminals 100A-100F are electrically connected to each other, and all of drain terminals 102A-102F are electrically connected to each other.

For example, transistors 90A-90F may represent transistor 56A in FIG. 3. Source terminals 100A-100F may be electrically connected to a high-side voltage rail that supplies voltage $V_{DDA}$. The control terminals of transistors 90A-90F may be configured to receive control signals 98, which may also be delivered to the control terminals of transistors 56A and 60A. If transistors 90A-90F are a part of transistor 56A in FIG. 3, then drain terminals 102A-102F may be electrically connected to a drain terminal of transistor 56B and a source terminal of low-side sensing switch 46B.

Each of transistors 90A-90F may be configured to conduct electricity in parallel or not conduct electricity in parallel by opening or closing switches 92A-92F. For example, to cause four of transistors 90A-90F to conduct electricity in parallel, signals 96A-96D may close switches 92A-92D, and signals 96E and 96F may open switches 96E and 96F. The ratio of branch circuitry 56 or 60 may be based on the number of active transistors 90A-90F that are configured to conduct electricity in parallel. Thus, the ratio 12 of FIG. 1 for low-side trimming may be four to one if switches 92A-92D are closed and switches 92E and 92F are open.

One of more of transistors 90A-90F may be configured to conduct electricity in parallel by many other methods. In some examples, the control terminals of transistors 90A-90F may be electrically disconnected from control signals 98 and electrically connected to a respective one of source terminals 100A-100F. To reconnect a transistor, the control terminal of the respective one of transistors 90A-90F may also be electrically connected to control signals 98 and electrically disconnected from a respective one of source terminals 100A-100F. Alternatively or additionally, a switch may be placed in series with each of drain terminals 102A-102F to form a cascode circuit with the respective one of transistors 90A-90F. The switch of each cascode circuit may be opened or closed to connect or disconnect the respective one of transistors 90A-90F. The switch of each cascode circuit may also have its control terminal connected or disconnected from the supply of the current mirror to connect or disconnect the respective one of transistors 90A-90F.

Figure 5:
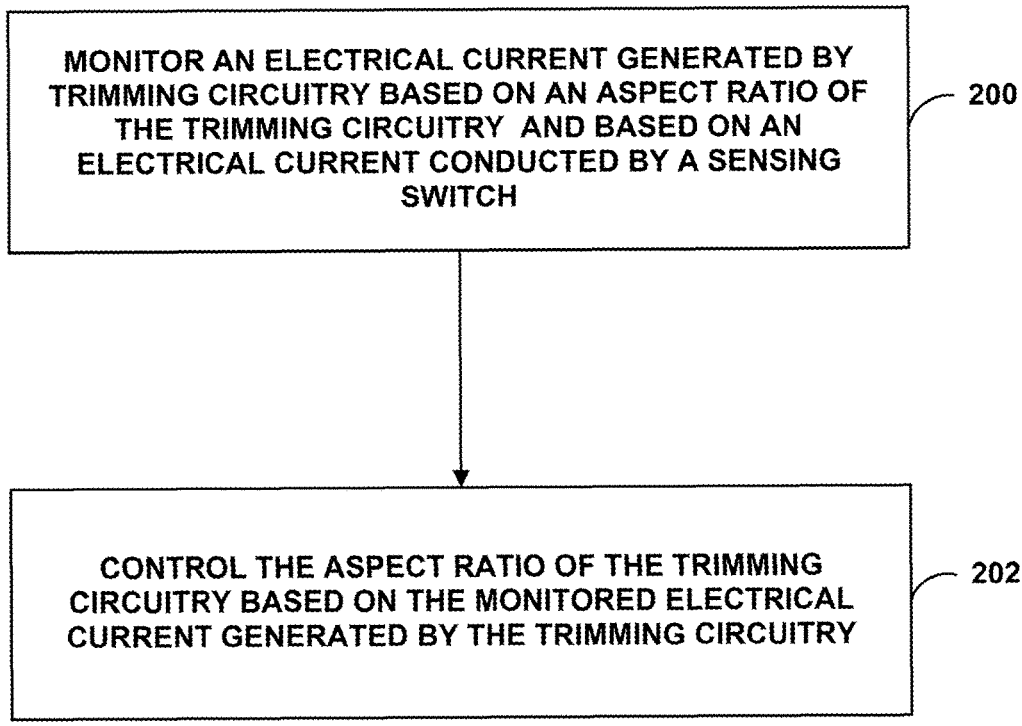
FIG. 5 is a flowchart illustrating a technique for monitoring an electrical current conducted by a power switch, in accordance with some examples of this disclosure.

FIG. 5 is a flowchart illustrating a technique 200 for monitoring an electrical current conducted by a power switch, in accordance with some examples of this disclosure. Technique 200 is described with reference to device 2 in FIGS. 1 and 2, although other components, such as power conversion system 40 in FIG. 3, may exemplify similar techniques.

The technique of FIG. 5 includes monitoring electrical current 14 generated by trimming circuitry 10, wherein trimming circuitry 10 is configured to generate monitored electrical current 14 based on aspect ratio 12 of trimming circuitry 10 and based on electrical current 8B conducted by sensing switch 6 (200). Sensing switch 6 is configured to conduct electrical current 8B based on electrical current 8A conducted by power switch 4. The monitoring of electrical current 14 may occur during a testing process in the factory and/or in the field. The monitoring may be administered by a technician or a microcontroller may conduct the testing. In some examples, monitored electrical current 14 may be monitored by the microcontroller with an analog-to-digital converter, and electrical current 8A may be monitored by an ammeter connected to device 2.

The technique of FIG. 5 also includes controlling aspect ratio 12 of trimming circuitry 10 based on monitored electrical current 14 generated by trimming circuitry 10 (202). If the ratio of the measured electrical current 8A and the measured monitored electrical current 14, which may be the KILIS factor, is equal to a target value, then aspect ratio 12 may not need adjustment. If the KILIS factor is not equal to the target value, however, then aspect ratio 12 may be adjusted by controlling the number of active transistors in trimming circuitry 10 configured to conduct electricity in parallel. Referring to trimming circuitry 10 of FIG. 2, controlling the number of active transistors may include selecting a number of active upper transistors of transistor 30A and selecting a number of active lower transistors of transistor 30B that are configured to conduct electricity in parallel. Adding transistors to branch circuitry 30, which may be represented by the variable L, may decrease monitored electrical current 14 generated by branch circuitry 32 by decreasing the value of M relative to L. Thus, the amplitude of monitored electrical current 14 may be based on the number of active transistors connected in parallel in transistors 30A and 30B.

Without trimming, adjusting, or selecting aspect ratio 12, the KILIS factor may not be equal to the target value. If the actual KILIS factor is lower than the target value, monitored electrical current 14 may be higher than expected when electrical current 8A is at a satisfactory level. As a result, a microcontroller may incorrectly decrease the duty cycle of the control signals delivered to power switch 4 to reduce the electrical power delivered to an electrical load. If the actual KILIS factor is higher than the target value, monitored electrical current 14 may be lower than expected. Even if electrical current 8A is at a satisfactory level, the microcontroller may increase the duty cycle of the control signals delivered to power switch 4. Thus, adjusting aspect ratio 12 may control the KILIS factor closer to the target value, reducing or eliminating the incorrect control of the duty cycle of the control signals delivered to the control terminal of power switch 4.

Figure 6:
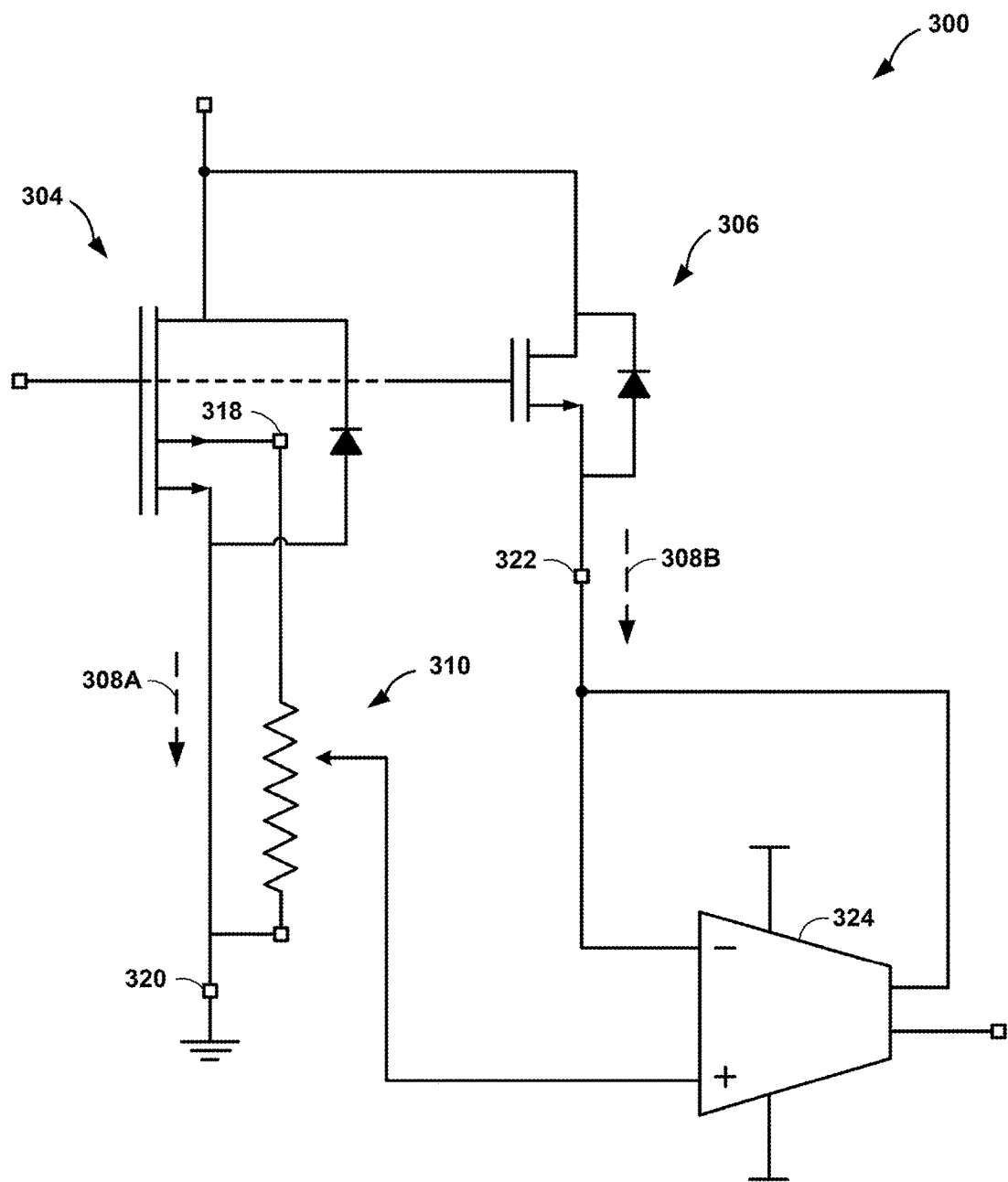
FIG. 6 is a circuit diagram of a device configured to regulate a terminal voltage of a sensing switch that is determined based on a reference voltage.

FIG. 6 is a circuit diagram of a device 300 configured to regulate a terminal voltage 322 of a sensing switch 306 that is determined based on a reference voltage. Device 300 is another possible solution to the problem of reducing the spread of the current ratio between power switch 304 and sensing switch 306. Device 300 may include resistor divider 310 positioned between two different points, also known as tapping points, taken on the source metallization of the power switch 304. One tapping point may be source terminal 320 of power switch 304, and the other tapping point may be terminal 318. Resistor divider 310 may operate similar to a potentiometer, where the divided voltage is adjustable at the time of production and/or in the field.

This solution may generate an artificial voltage drop that, divided into steps, provides the trimmed voltage reference used by operational amplifier 324 as one of its inputs. The other input of the operational amplifier may be electrically connected to source terminal 322 of the sensing switch 306. Sensing switch 306 may be a scaled replica (1 to N) of power switch 304. In this way, the electrical current flowing through sensing switch 306, that should be ideally N times smaller than the electrical current flowing through power switch 304, can be trimmed in order to have exactly the ratio N, although the accuracy depends on the step size decided.

The current ratio may be dependent on the temperature of device 300. This dependence may be due to the resistance in the source metallization of power switch 304, in parallel with the external resistor, which might be different from that of sensing switch 306. There may be a limited voltage drop achievable in the source metallization of power switch 304 that restricts the trimming capability of device 300. In addition, it may be difficulty to drive the trimming switches in case that mirror circuitry is used in high-side configuration. Lastly, two pads may be necessary for connecting the external resistor.

Further example details of sensing switches can be found in U.S. Pat. No. 9,152,163, issued Oct. 6, 2015, and entitled "Regulation of a Load Current-to-Sensing Current Ratio in a Current Sensing Power Metal-Oxide-Semiconductor Field-Effect Transistor (MOSFET)," which is incorporated herein by reference in its entirety.

The following numbered examples demonstrate one or more aspects of the disclosure.

Example 1

A device includes a power switch, a sensing switch configured to conduct an electrical current based on an electrical current conducted by the power switch. The device also includes trimming circuitry configured to generate a monitored electrical current based on an aspect ratio of the trimming circuitry and based on the electrical current conducted by the sensing switch, wherein the aspect ratio of the trimming circuitry is adjustable.

Example 2

The device of example 1, wherein the aspect ratio of the trimming circuitry is based on a number of active transistors that are configured to conduct electricity in parallel, and wherein the number of active transistors is adjustable.

Example 3

The device of examples 1-2 or any combination thereof, further including an operational amplifier configured to drive the trimming circuitry based on the electrical current conducted by the power switch and the electrical current conducted by the sensing switch.

Example 4

The device of examples 1-3 or any combination thereof, wherein the trimming circuitry includes first branch circuitry configured to be driven by the operational amplifier and second branch circuitry configured to be driven by the electrical current conducted by the sensing switch. The trimming circuitry also includes third branch circuitry configured to generate the monitored electrical current based on an aspect ratio between the second branch circuitry and the third branch circuitry.

Example 5

The device of examples 1-4 or any combination thereof, wherein the second branch circuitry includes a number of active upper transistors and a number of active lower transistors, wherein the number of active lower transistors is adjustable, and wherein the number of active upper transistors is adjustable.

Example 6

The device of examples 1-5 or any combination thereof, wherein the aspect ratio between the second branch circuitry and the third branch circuitry is adjustable by at least selecting the number of active upper transistors configured to conduct electricity in the second branch circuitry and selecting the number of active lower transistors configured to conduct electricity in the second branch circuitry.

Example 7

The device of examples 1-6 or any combination thereof, wherein an amplitude of the monitored electrical current is based on the number of active upper transistors connected in parallel in the second branch circuitry and based on the number of active lower transistors connected in parallel in the second branch circuitry.

Example 8

The device of examples 1-7 or any combination thereof, wherein a first input node of the operational amplifier is electrically connected to a load terminal of the power switch, and wherein a second input node of the operational amplifier is electrically connected to a load terminal of the sensing switch.

Example 9

A method for monitoring an electrical current conducted by a power switch, where the method includes monitoring an electrical current generated by trimming circuitry, wherein the trimming circuitry is configured to generate the monitored electrical current based on an aspect ratio of the trimming circuitry and based on an electrical current conducted by a sensing switch, and wherein the sensing switch is configured to conduct the electrical current based on an electrical current conducted by the power switch. The method further includes controlling the aspect ratio of the trimming circuitry based on the monitored electrical current generated by the trimming circuitry.

Example 10

The method of example 9, wherein controlling the aspect ratio of the trimming circuitry includes controlling a number of active transistors in the trimming circuitry that are configured to conduct electricity in parallel.

Example 11

The method of examples 9-10 or any combination thereof, wherein first branch circuitry of the trimming circuitry is configured to be driven by the electrical current conducted by the sensing switch, wherein second branch circuitry of the trimming circuitry is configured to generate the monitored electrical current based on an aspect ratio between the first branch circuitry and the second branch circuitry, and wherein controlling the aspect ratio of the trimming circuitry includes controlling the aspect ratio between first branch circuitry and second branch circuitry.

Example 12

The method of examples 9-11 or any combination thereof, wherein the first branch circuitry includes a number of active upper transistors and a number of active lower transistors, and wherein controlling the aspect ratio between first branch circuitry and second branch circuitry includes selecting the number of active upper transistors in the first branch circuitry and selecting the number of active lower transistors in the first branch circuitry.

Example 13

The method of examples 9-12 or any combination thereof, wherein an amplitude of the monitored electrical current is based on the number of active upper transistors connected in parallel in the first branch circuitry and based on the number of active lower transistors connected in parallel in the first branch circuitry.

Example 14

A power conversion system includes half-bridge circuitry including a high-side power switch and a low-side power switch. The power conversion system further includes a high-side sensing switch configured to conduct an electrical current based on an electrical current conducted by the high-side power switch and a low-side sensing switch configured to conduct an electrical current based on an electrical current conducted by the low-side power switch. The power conversion system also includes trimming circuitry configured to generate a monitored electrical current based on an aspect ratio of the trimming circuitry and based on the electrical current conducted by the high-side sensing switch or the electrical current conducted by the low-side sensing switch, wherein the aspect ratio of the trimming circuitry is adjustable.

Example 15

The power conversion system of example 14, wherein the aspect ratio of the trimming circuitry is based on a number of active transistors that are configured to conduct electricity in parallel, and wherein the number of active transistors is adjustable.

Example 16

The power conversion system of examples 14-15 or any combination thereof, further including gate driver circuitry configured to deliver high-side control signals to the high-side power switch and the high-side sensing switch, deliver low-side control signals to the low-side power switch and the low-side sensing switch, and control whether the trimming circuitry generates the monitored electrical current based on the electrical current conducted by the high-side sensing switch or based on the electrical current conducted by the low-side sensing switch.

Example 17

The power conversion system of examples 14-16 or any combination thereof, further including a high-side operational amplifier configured to drive the trimming circuitry based on the electrical current conducted by the high-side power switch and the electrical current conducted by the high-side sensing switch. The power conversion system also includes a low-side operational amplifier configured to drive the trimming circuitry based on the electrical current conducted by the low-side power switch and the electrical current conducted by the low-side sensing switch. The gate driver circuitry is configured to control whether the trimming circuitry generates the monitored electrical current based on the electrical current conducted by the high-side sensing switch or based on the electrical current conducted by the low-side sensing switch by at least controlling whether the high-side operational amplifier drives the trimming circuitry and controlling whether the low-side operational amplifier drives the trimming circuitry.

Example 18

The power conversion system of examples 14-17 or any combination thereof, wherein the trimming circuitry includes first branch circuitry configured to be driven by the high-side operational amplifier or the low-side operational amplifier. The trimming circuitry also includes second branch circuitry configured to be driven by the electrical current conducted by the high-side sensing switch. The trimming circuitry includes third branch circuitry configured to be driven by the electrical current conducted by the low-side sensing switch. The trimming circuitry further includes fourth branch circuitry configured to generate the monitored electrical current based on an aspect ratio between the second branch circuitry and the fourth branch circuitry or based on an aspect ratio between the third branch circuitry and the fourth branch circuitry.

Example 19

The power conversion system of examples 14-18 or any combination thereof, wherein the aspect ratio between the second branch circuitry and the fourth branch circuitry is adjustable by selecting a number of active transistors connected in parallel in the second branch circuitry. The aspect ratio between the third branch circuitry and the fourth branch circuitry is adjustable by selecting a number of active transistors connected in parallel in the third branch circuitry.

Example 20

The power conversion system of examples 14-19 or any combination thereof, further including processing circuitry configured to measure the monitored electrical current generated by the trimming circuitry. The processing circuitry is configured to control the aspect ratio of the trimming circuitry based on an amplitude of the monitored electrical current.

Example 21

The device of examples 1-8 or any combination thereof, wherein the aspect ratio of the trimming circuitry is based on characteristics of passive elements of the trimming circuitry.

Example 22

The device of examples 1-8 and 21 or any combination thereof, wherein the trimming circuitry includes current mirror circuitry, and wherein the aspect ratio of the trimming circuitry includes an aspect ratio of the current mirror circuitry.

Various examples of the disclosure have been described. Any combination of the described systems, operations, or functions is contemplated. These and other examples are within the scope of the following claims.

What is claimed is:

1. A device comprising:
a power switch;
a sensing switch configured to conduct an electrical current based on an electrical current conducted by the power switch; and
trimming circuitry configured to generate a monitored electrical current based on an aspect ratio of the trimming circuitry and based on the electrical current conducted by the sensing switch,
wherein the aspect ratio of the trimming circuitry is based on a number of active transistors that are configured to conduct electricity in parallel, and
wherein the aspect ratio of the trimming circuitry is adjustable by adjusting the number of active transistors.

2. The device of claim 1, further comprising an operational amplifier configured to drive the trimming circuitry based on the electrical current conducted by the power switch and the electrical current conducted by the sensing switch.

3. The device of claim 2, wherein the trimming circuitry includes:
first branch circuitry configured to be driven by the operational amplifier;
second branch circuitry configured to be driven by the electrical current conducted by the sensing switch; and
third branch circuitry configured to generate the monitored electrical current based on an aspect ratio between the second branch circuitry and the third branch circuitry.

4. The device of claim 3, wherein the second branch circuitry includes the number of active transistors including a number of active upper transistors and a number of active lower transistors, wherein the number of active lower transistors is adjustable, and wherein the number of active upper transistors is adjustable.

5. The device of claim 4, wherein the aspect ratio between the second branch circuitry and the third branch circuitry is adjustable by at least:
selecting the number of active upper transistors configured to conduct electricity in the second branch circuitry; and
selecting the number of active lower transistors configured to conduct electricity in the second branch circuitry.

6. The device of claim 5, wherein an amplitude of the monitored electrical current is based on the number of active upper transistors connected in parallel in the second branch circuitry and based on the number of active lower transistors connected in parallel in the second branch circuitry.

7. The device of claim 2, wherein a first input node of the operational amplifier is electrically connected to a load terminal of the power switch, and wherein a second input node of the operational amplifier is electrically connected to a load terminal of the sensing switch.

8. The device of claim 1, wherein the aspect ratio of the trimming circuitry is further based on characteristics of passive elements of the trimming circuitry.

9. The device of claim 1, wherein the trimming circuitry includes current mirror circuitry, and wherein the aspect ratio of the trimming circuitry includes an aspect ratio of the current mirror circuitry.

10. The device of claim 9,
wherein the current mirror circuitry includes the number of active transistors configured to conduct electricity in parallel, and
wherein the aspect ratio of the current mirror circuitry is adjustable by adjusting the number of active transistors.

11. A method for monitoring an electrical current conducted by a power switch, the method comprising:
monitoring an electrical current generated by trimming circuitry, wherein the trimming circuitry is configured to generate the monitored electrical current based on an aspect ratio of the trimming circuitry and based on an electrical current conducted by a sensing switch, wherein the sensing switch is configured to conduct the electrical current based on the electrical current conducted by the power switch; and
controlling the aspect ratio of the trimming circuitry based on the monitored electrical current generated by the trimming circuitry by at least controlling a number of active transistors in the trimming circuitry that are configured to conduct electricity in parallel.

12. The method of claim 11,
wherein first branch circuitry of the trimming circuitry is configured to be driven by the electrical current conducted by the sensing switch;
wherein second branch circuitry of the trimming circuitry is configured to generate the monitored electrical current based on an aspect ratio between the first branch circuitry and the second branch circuitry; and
wherein the first branch circuitry includes the number of active transistors including a number of active upper transistors and a number of active lower transistors, the method further comprising:
selecting the number of active upper transistors in the first branch circuitry; and
selecting the number of active lower transistors in the first branch circuitry.

13. A power conversion system comprising:
half-bridge circuitry including a high-side power switch and a low-side power switch;
a high-side sensing switch configured to conduct an electrical current based on an electrical current conducted by the high-side power switch;
a low-side sensing switch configured to conduct an electrical current based on an electrical current conducted by the low-side power switch; and
trimming circuitry configured to generate a monitored electrical current based on an aspect ratio of the trimming circuitry and based on the electrical current conducted by the high-side sensing switch or the electrical current conducted by the low-side sensing switch,
wherein the aspect ratio of the trimming circuitry is based on a number of active transistors that are configured to conduct electricity in parallel, and
wherein the aspect ratio of the trimming circuitry is adjustable by adjusting the number of active transistors.

14. The power conversion system of claim 13, further comprising gate driver circuitry configured to:
deliver high-side control signals to the high-side power switch and the high-side sensing switch;
deliver low-side control signals to the low-side power switch and the low-side sensing switch; and
control whether the trimming circuitry generates the monitored electrical current based on the electrical current conducted by the high-side sensing switch or based on the electrical current conducted by the low-side sensing switch.

15. The power conversion system of claim 14, further comprising:
a high-side operational amplifier configured to drive the trimming circuitry based on the electrical current conducted by the high-side power switch and the electrical current conducted by the high-side sensing switch; and
a low-side operational amplifier configured to drive the trimming circuitry based on the electrical current conducted by the low-side power switch and the electrical current conducted by the low-side sensing switch,
wherein the gate driver circuitry is configured to control whether the trimming circuitry generates the monitored electrical current based on the electrical current conducted by the high-side sensing switch or based on the electrical current conducted by the low-side sensing switch by at least:
controlling whether the high-side operational amplifier drives the trimming circuitry; and
controlling whether the low-side operational amplifier drives the trimming circuitry.

16. The power conversion system of claim 15, wherein the trimming circuitry includes:
first branch circuitry configured to be driven by the high-side operational amplifier or the low-side operational amplifier;
second branch circuitry configured to be driven by the electrical current conducted by the high-side sensing switch;
third branch circuitry configured to be driven by the electrical current conducted by the low-side sensing switch; and
fourth branch circuitry configured to generate the monitored electrical current based on an aspect ratio between the second branch circuitry and the fourth branch circuitry or based on an aspect ratio between the third branch circuitry and the fourth branch circuitry.

17. The power conversion system of claim 16,
wherein the number of active transistors includes active transistors connected in parallel in the second branch circuitry and active transistors connected in parallel in the third branch circuitry,
wherein the aspect ratio between the second branch circuitry and the fourth branch circuitry is adjustable by selecting a number of the active transistors connected in parallel in the second branch circuitry, and
wherein the aspect ratio between the third branch circuitry and the fourth branch circuitry is adjustable by selecting a number of the active transistors connected in parallel in the third branch circuitry.

18. The power conversion system of claim 13, further comprising processing circuitry configured to:
measure the monitored electrical current generated by the trimming circuitry; and
control the aspect ratio of the trimming circuitry based on an amplitude of the monitored electrical current.

19. The power conversion system of claim 13, wherein the trimming circuitry includes current mirror circuitry including the number of active transistors configured to conduct electricity in parallel, and wherein the aspect ratio of the trimming circuitry includes an aspect ratio of the current mirror circuitry that is adjustable by adjusting the number of active transistors.

20. A device comprising:
a power switch;
a sensing switch configured to conduct an electrical current based on an electrical current conducted by the power switch; and
trimming circuitry including current mirror circuitry and configured to generate a monitored electrical current based on an aspect ratio of the current mirror circuitry and based on the electrical current conducted by the sensing switch, wherein the aspect ratio of the current mirror circuitry is adjustable.

21. A device comprising:
a power switch;
a sensing switch configured to conduct an electrical current based on an electrical current conducted by the power switch;
an operational amplifier; and
trimming circuitry comprising:
first branch circuitry, wherein the operational amplifier is configured to drive the first branch circuitry based on the electrical current conducted by the power switch and the electrical current conducted by the sensing switch;
second branch circuitry configured to be driven by the electrical current conducted by the sensing switch; and
third branch circuitry configured to generate a monitored electrical current based on the electrical current conducted by the sensing switch and further based on an aspect ratio between the second branch circuitry and the third branch circuitry, wherein the aspect ratio between the second branch circuitry and the third branch circuitry is adjustable.

* * * * *